United States Patent
Suzuki et al.

(10) Patent No.: US 12,539,567 B2
(45) Date of Patent: Feb. 3, 2026

(54) SHEET-SHAPED SOLDER

(71) Applicant: FUJI ELECTRIC CO., LTD., Kawasaki (JP)

(72) Inventors: Katsunori Suzuki, Matsumoto (JP); Hidenao Kuribayashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 640 days.

(21) Appl. No.: 17/974,009

(22) Filed: Oct. 26, 2022

(65) Prior Publication Data
US 2023/0173620 A1 Jun. 8, 2023

(30) Foreign Application Priority Data
Dec. 8, 2021 (JP) .................. 2021-198961

(51) Int. Cl.
*B23K 35/26* (2006.01)
*H05K 3/34* (2006.01)

(52) U.S. Cl.
CPC ......... *B23K 35/262* (2013.01); *H05K 3/3478* (2013.01)

(58) Field of Classification Search
CPC ......... H01L 21/60; H01L 21/52; H01L 23/48; B23K 1/00; B23K 35/24; B23K 35/26; B23K 35/262; C22C 13/00; C22C 13/02; H05K 3/3478; H05K 3/363; H05K 3/365; H05K 3/366; H05K 3/36; H05K 3/3457; H05K 3/00

USPC .................. 174/263, 250, 262; 361/761, 743
See application file for complete search history.

(56) References Cited

U.S. PATENT DOCUMENTS

| | | | |
|---|---|---|---|
| 10,361,651 B2 * | 7/2019 | White | B25F 5/02 |
| 12,246,398 B2 * | 3/2025 | Akai | B23K 3/087 |
| 12,272,614 B2 * | 4/2025 | Saha | H01L 23/42 |

FOREIGN PATENT DOCUMENTS

JP 2016051844 A 11/2016

* cited by examiner

Primary Examiner — Angel R Estrada

(57) ABSTRACT

A sheet-shaped solder that is not susceptible to electromigration, and a solder joint part and semiconductor device using the same are provided. A pressed sheet-shaped solder containing a solder alloy containing Sn as a primary component, an additional element, and an incidental impurity is provided. A pressed surface of the sheet-shaped solder is a surface perpendicular to a main surface of the sheet-shaped solder, and c-axes of Sn crystals are aligned in a direction perpendicular to a thickness direction of the sheet-shaped solder. Moreover, a solder joint part including a semiconductor element, and an electrically conductive connection member, and a solder joining layer being the above sheet-shaped solder melted between the semiconductor element and the electrically conductive connection member is provided.

9 Claims, 4 Drawing Sheets

SHEET-SHAPED SOLDER

CROSS-REFERENCE TO RELATED APPLICATION

This application claims priority from Japanese Patent Application No. 2021-198961, filed on Dec. 8, 2021, which is incorporated herein by reference in their entirety.

BACKGROUND OF THE INVENTION

Field of the Invention

The present invention relates to a sheet-shaped solder, to a solder joint, and to a semiconductor device including the same. The present invention particularly relates to a sheet-shaped solder and to a solder joint usable for semiconductor devices which are not susceptible to electromigration even when a large current is caused to flow therethrough, and to a highly reliable semiconductor device including the same.

Description of Related Art

Power semiconductor modules have been widely used in fields that require efficient power conversion. For example, the area of application has expanded to the field of power electronics such as in industrial equipment, electric vehicles, and household appliances. These power semiconductor modules incorporate switching elements and diodes, and silicon (Si) semiconductor elements and silicon carbide (SiC) semiconductor elements have been used as the elements.

In recent years, the density of currents flowing through semiconductor elements has increased. In particular, in the case of a large current with a current density of about 800 $A/cm^2$, electromigration (EM) may occur at solder joints, which may cause a local energization failure.

For joining of semiconductor elements, SnSb-based solders, SnSbAg-based solders, and the like, have conventionally been used from the viewpoints of melting point, strength, etc. These solder materials contain tin (Sn) as a primary component, and they have structures in which Sn crystals are randomly oriented. It has been known that Sn forming solder materials are susceptible to EM depending on the direction of a current relative to the overall orientation of Sn (see Patent Literature 1, for example). While EM occurs with a structure in which Sn crystals are randomly oriented, EM occurs easily when a current flows in the direction of the c-axis of the Sn crystal lattice, and EM does not easily occur when a current flows in a direction perpendicular to the c-axis. Patent Literature 1 discloses a technique in which an electric field or a magnetic field is applied to melted solder at the time of joining elements in manufacture of a semiconductor device to make the c-axis of the solder perpendicular to the flow direction of a current.

CITATION LIST

Patent Literature

[Patent Literature 1] Japanese Patent Application Publication No. 2016-51844

SUMMARY OF THE INVENTION

With the technique disclosed in Patent Literature 1, it is theoretically possible to align the c-axes of Sn crystal lattices in a predetermined direction. The process, however, is complicated and requires costly equipment and is therefore not practical.

There is a demand for a solder for implementing a semiconductor device not susceptible electromigration even when a large current with a current density of about 800 $A/cm^2$ is caused to flow therethrough.

As a result of intensive research, the present inventors have found that, by compressing a solder with randomly oriented Sn crystals in a predetermined direction, the solder can be plastically deformed such that the c-axes of Sn crystal lattices become aligned in parallel to the direction of the compression. This has led the present inventors to complete the present invention.

An embodiment of the present invention relates to a pressed sheet-shaped solder containing a solder alloy containing Sn as a primary component, at least one additional element, and an incidental impurity. A pressed surface of the sheet-shaped solder is a surface perpendicular to a main surface of the sheet-shaped solder, and c-axes of Sn crystals are aligned in a direction perpendicular to a thickness direction of the sheet-shaped solder.

Preferably, in the sheet-shaped solder, a degree of c-axis alignment being an index of an overall c-axis orientation of Sn crystals in the pressed surface is not less than 0.3. Preferably, in the sheet-shaped solder, the degree of c-axis alignment is not greater than 0.95.

Preferably, in the sheet-shaped solder, the additional element is selected from among Sb, Cu, Ag, Ni, Ge, and combinations thereof.

Another embodiment of the present invention relates to a solder joint including: a semiconductor element; an electrically conductive connection member; and a solder joining layer being the above sheet-shaped solder melted between the semiconductor element and the electrically conductive connection member.

Preferably, in the solder joint, the electrically conductive connection member is a lead frame.

Still another embodiment of the present invention relates to a semiconductor device including the above solder joint.

Still another embodiment of the present invention relates to a method of manufacturing a semiconductor device including: pressing a solder alloy containing Sn as a primary component, an additional element, and an incidental impurity to thereby manufacture a sheet-shaped solder in which pressed surface is a surface perpendicular to a main surface of the sheet-shaped solder and in which c-axes of Sn crystals are aligned perpendicularly to a thickness direction of the sheet-shaped solder; laminating a semiconductor element, the sheet-shaped solder, and an electrically conductive connection member; and melting the sheet-shaped solder.

Preferably, in the method of manufacturing the semiconductor device, the pressing includes applying a pressure until a degree of c-axis alignment being an index of an overall c-axis orientation of Sn crystals reaches not less than 0.3.

In a sheet-shaped solder according to the present invention, the c-axes of Sn crystal lattices are aligned in a direction perpendicular to the thickness direction. Thus, by joining semiconductor elements with this sheet-shaped solder, it is possible to manufacture a semiconductor device that prevents electromigration and therefore has high reliability.

DESCRIPTION OF PREFERRED EMBODIMENTS

Figure 1A:
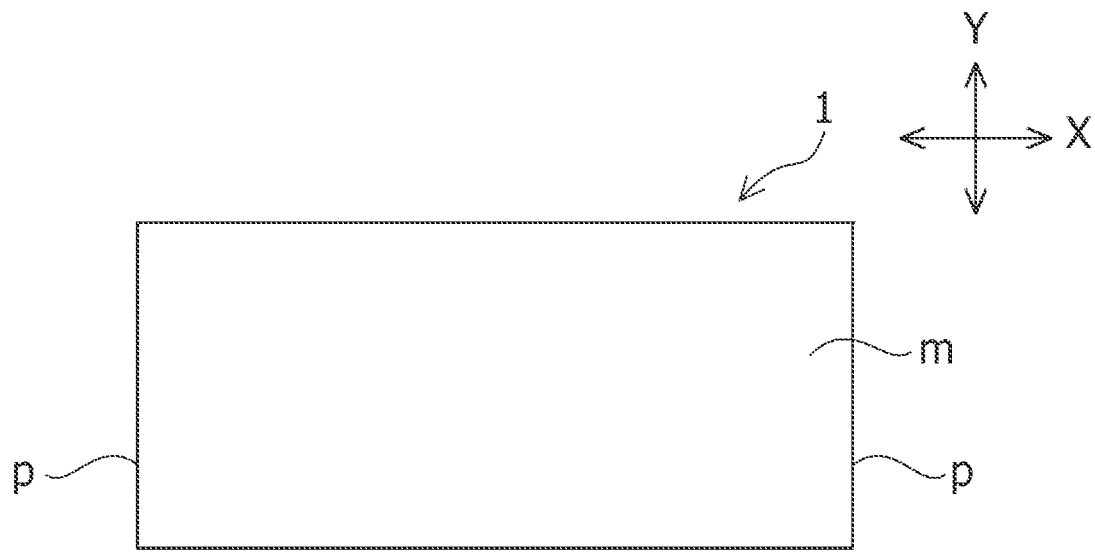
FIGS. 1A and 1B are conceptual explanatory diagrams illustrating a sheet-shaped solder according to a first embodiment of the present invention, FIG. 1A being a conceptual plan view, FIG. 1B being a conceptual cross-sectional view.

Embodiments of the present invention will be described below with reference to the drawings. It is to be noted that the present invention is not limited by the embodiments described below.

First Embodiment: Sheet-shaped Solder

According to a first embodiment, the present invention relates to a sheet-shaped solder (a sheet solder). The sheet-shaped solder according to the present embodiment is a sheet-shaped solder which contains a solder alloy containing Sn as a primary component, at least one additional element, and incidental impurities, and is pressed such that the c-axes of Sn crystals are aligned perpendicularly to the thickness direction of the sheet.

A sheet-shaped solder herein refers to a solder processed into a sheet shape having a predetermined length, width, and thickness, with the thickness being smaller than the length and the width. More specifically, a thickness "t" may be not greater than about 500 μm and not less than about 5 μm, and it is preferably not greater than about 300 μm and not less than about 10 μm. The thickness "t" of the sheet-shaped solder typically corresponds to a thickness into which a pressed solder block is cut in the manufacturing method described below. The length and width of the sheet-shaped solder are not particularly limited, and the solder may be in the form of a plate or a roll as long as it is in a sheet shape. The solder may be cut into a shape suitable for products to be joined. The length and width of the sheet-shaped solder vary by the products for which the solder is to be used, and are not particularly limited. Nonetheless, the length and width of the sheet-shaped solder may be greater than 500 μm and generally not less than 2000 μm. The length and width of the sheet-shaped solder can typically be determined based on the dimensions and shapes of the dies used in the manufacturing method described below.

The sheet-shaped solder contains a solder alloy and preferably consists of the solder alloy. The constitution of the solder alloy may be such that it contains Sn as a primary component, at least one additional element, and incidental impurities. The constitution of the solder alloy is preferably such that it is a lead-free solder alloy not containing Pb other than Pb as an incidental impurity. Containing Sn as a primary component means that Sn makes up not less than 80% by mass relative to the total mass of the solder alloy being 100%. By plastically deforming the solder alloy with Sn making up not less than 80% by mass by pressing or the like, the c-axes of its Sn crystal lattices can be aligned in a similar manner to a solder practically consisting only of Sn. Specifically, by compressing the above Sn solder alloy by pressing, the Sn solder alloy is plastically deformed such that the c-axes are aligned in a direction parallel to the pressed surfaces. Note that the pressing is a working process by which a workpiece is deformed by being brought into pressure contact with a metal die and pressed from one predetermined direction (pressing direction).

The at least one additional element is an element other than Sn and is not particularly limited as long as it is one usually used in solder alloys. Examples of the additional element include, but are not limited to, Sb, Cu, Ag, Ni, Ge, P, Bi, In, Si, V, Au, Pt, Mo, Zn, Co, Fe, Mn, Cr, and Ti. One additional element may be contained or two or more additional elements may be contained. However, the total mass of the additional elements contained is less than 20% by mass of the total mass of the solder alloy. The incidental impurities may generally be, but are not limited to, Cu, Ni, Zn, Fe, Al, As, Cd, Au, In, P, Pb, etc. The content of the incidental impurities may be within a range of values specified for the corresponding alloy system by the International Organization for Standardization or industrial standards in the country of interest. Also, by RoHS (Restriction of Hazardous Substances) directive, it is preferable that Hg not be contained, Cr (VI) be less than 0.1% by mass of the total mass of the solder alloy, and Cd be less than 0.01% by mass of the total mass of the solder alloy.

Regarding a more specific constitution of the solder alloy, it is possible to use solder alloys of alloy systems such as Sn—Ag—Cu-based, Sn—Sb-based, Sn—Sb—Ag-based, Sn—Cu-based, Sn—Sb—Ag—Cu-based, Sn—Cu—Ni-based, and Sn—Ag-based alloy systems which contain not less than 80% by mass of Sn. However, the solder alloy is not limited to these. More specifically, for a Sn—Ag—Cu-based alloy, it is preferable that Ag be contained in a range of 0.5 to 5.0% by mass and Cu be contained in a range of 0.1 to 3.0% by mass. For a Sn—Sb-based alloy, it is preferable that Sb be contained in a range of 2.0 to 20% by mass. For a Sn—Sb—Ag-based alloy, it is preferable that Sb be contained in a range of 6.0 to 8.0% by mass and Ag be contained in a range of 2.0 to 4.0% by mass. For a Sn—Cu-based alloy, it is preferable that Cu be contained in a range of 0.1 to 10.0% by mass. For a Sn—Sb—Ag—Cu-based alloy, it is preferable that Sb be contained in a range of 5.0 to 10% by mass, Ag be contained in a range of 2.0 to 4.0% by mass, and Cu be contained in a range of 0.1 to 1.2% by mass. For a Sn—Cu—Ni-based alloy, it is preferable that Cu be contained in a range of 0.1 to 6.0% by mass, and Ni be contained in a range of 0.1 to 0.5% by mass. For a Sn—Ag-based alloy, it is preferable that Ag be contained in a range of 1.0 to 6.0% by mass.

In one embodiment, the sheet-shaped solder may be made of a solder alloy having a substantially uniform constitution over the entire sheet. In another embodiment, the sheet-shaped solder may be an alloy with any of the constitutions specified above containing high melting-point metal particles therein. The high melting-point metal particles may, for example, be particles containing Ni, Ag, Cu, Fe, stainless steel, or an alloy of these, and having an average particle size of approximately 1 to 50 μm. The content of the high melting-point metal particles in the sheet-shaped solder may be about 1 to 40% by mass. In still another embodiment, the sheet-shaped solder may be an alloy with any of the constitutions specified above containing a high melting-point metal wire therein. The constitution of the high melting-point metal wire may be selected from among constitutions similar to those for the high melting-point metal particles, and the diameter may be approximately 1 to 50 μm. The content of the high melting-point metal wire in the sheet-shaped solder may be about 1 to 40% by mass.

Figure 1B:
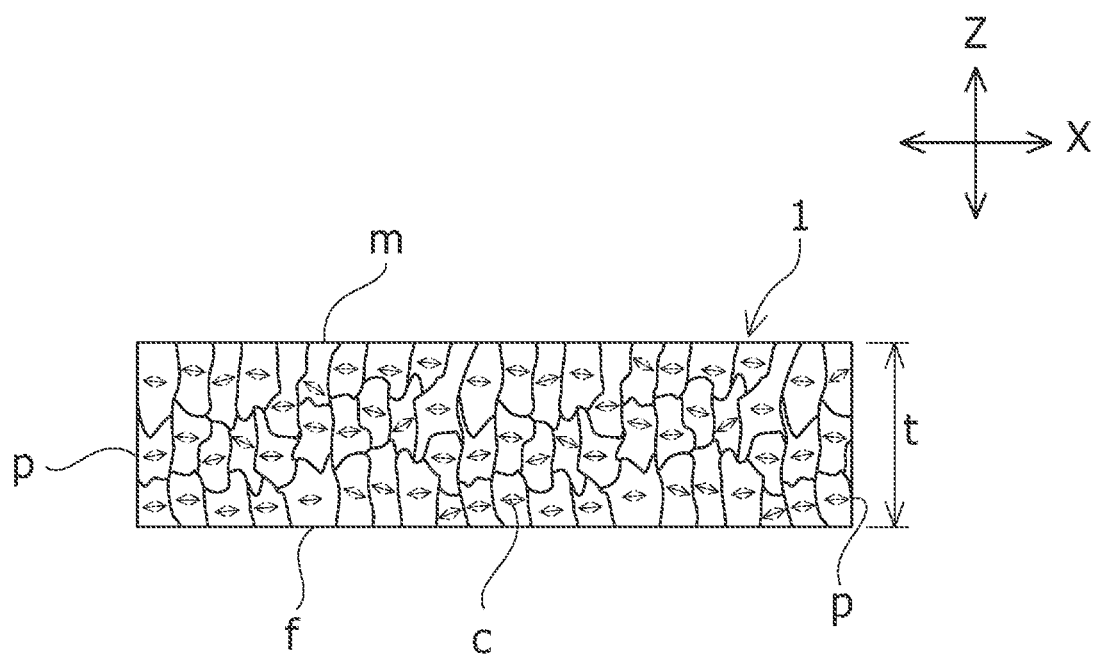

FIGS. 1A and 1B are a conceptual plan view and cross-sectional view, respectively, illustrating an example of the sheet-shaped solder according to the present embodiment. The X, Y, and Z in FIGS. 1A and 1B represent the length direction, width direction, and thickness direction of the sheet-shaped solder, respectively. The sheet-shaped solder is a solder pressed in one direction and cut along a plane parallel to the direction of the pressing, and has a main surface "m" defined by the length direction and the width direction and a surface "f" opposed to the main surface "m". FIG. 1B is a conceptual diagram illustrating a cross section obtained by cutting the sheet-shaped solder perpendicularly to the main surface "m". Referring to FIG. 1B, the sheet-shaped solder is made of a solder alloy with thickness "t", and the c-axes of its Sn crystals are aligned perpendicularly to the thickness direction Z of the solder. Moreover, the c-axes of the Sn crystals forming the solder alloy are aligned in parallel to the main surface "m" of the sheet-shaped solder. One of the pairs of opposed side surfaces of the sheet-shaped solder perpendicular to the main surface "m" are surfaces "p" pressed at the time of manufacture. The surfaces "p" pressed herein will also be referred to "pressed surfaces". In FIG. 1B, each region surrounded by a solid line represents a Sn crystal grain, and the arrow in the region represents the orientation of the c-axis of the Sn crystals. The solid lines representing the Sn crystal lattices are illustrated for explanatory purposes, and they greatly differ from the actual scales. Incidentally, each region surrounded by a solid line can also be interpreted as a single-crystal region. A single-crystal region is a concept that the region in which crystals are aligned in a single direction and the region does not include twinned crystals or the like.

The c-axes of the Sn crystals in the sheet-shaped solder according to the present embodiment being aligned in a predetermined direction can be confirmed by EBSD. EBSD is commonly known as a surface analysis method in which accelerated electrons are applied to a sample surface in vacuo, and the Kikuchi pattern obtained by the electron backscatter occurring thereat is analyzed to determine the crystal orientation. By applying an electron beam to a sample surface (measurement surface), the crystal orientation at that region can be obtained. Thus, by scanning an electron beam over a predetermined region, it is possible to obtain a crystal orientation map of the crystal grains in the scanned region. The range of a single measurement point with an electron beam is within a circle with a diameter of 10 nm. By making an electron beam incident at an angle of approximately 20° on one of the pressed surfaces "p" or the main surface "m" of the sheet-shaped solder illustrated in FIGS. 1A and 1B, the overall c-axis orientation of Sn in the sheet-shaped solder can be evaluated.

Figure 2A:
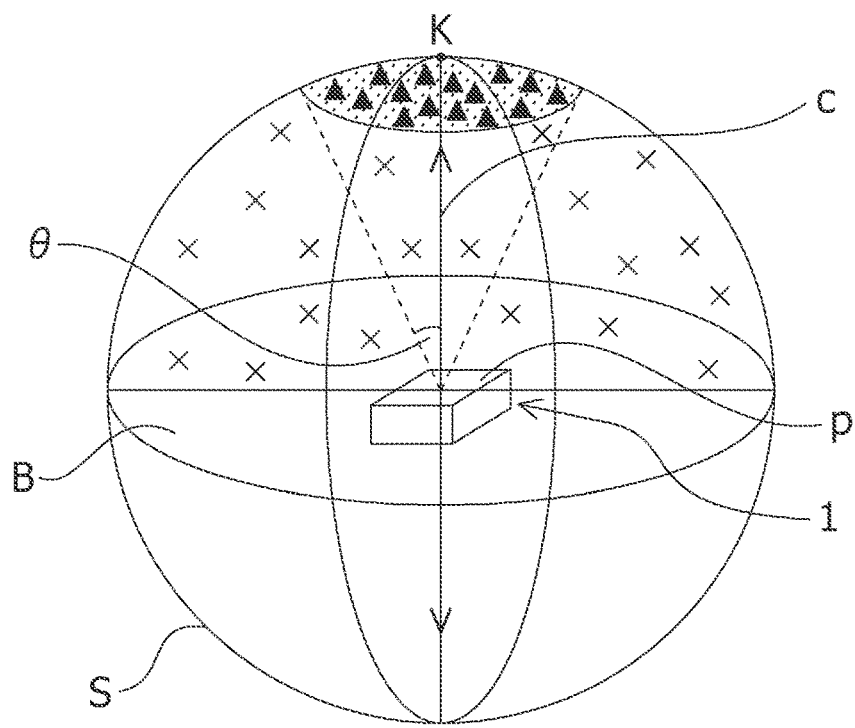
FIGS. 2A and 2B are diagrams illustrating an overview of electron backscatter diffraction (EBSD) measurement for identifying the overall orientation of c-axes in a sheet-shaped solder, FIG. 2A being a diagram explaining displays on a projection sphere, FIG. 2B being a diagram illustrating an example of a crystal orientation map obtained by extracting crystals with specific orientations.

A Sn crystal is a tetragonal crystal (β-Sn structure) having lattice constants of a=b=5.832 Å and c=3.181 Å at approximately 13° C. to 200° C., and has four Sn atoms within a unit cell. The c-axis represents the axis with a length of 3.181 Å mentioned above. A method of evaluating the overall c-axis orientation will now be described. The orientation of a crystal is represented by the inclinations of lines normal to its crystal planes relative to a reference plane. The orientation planes of each crystal can be described as the inclinations of normal lines extending radially from one point within the crystal and a reference plane. With intersection points between the normal lines and a virtual sphere (projection sphere) centered at one point within the crystal, the orientation planes of the crystal at respective measurement positions can be expressed. FIG. 2A is a diagram explaining display of a virtual projection sphere in EBSD. In FIG. 2A, S represents the projection sphere, and B represents the reference plane.

A case in which a measurement target is one Sn crystal grain (single-crystal grain) will be described. When the c-axis of the Sn crystal grain is aligned perpendicularly to the reference plane, an orientation point is marked at the very top of the projection sphere. The very top of the projection sphere is the point at which a line perpendicular to the reference plane and passing through the center of the projection sphere crosses the side of the projection sphere above the reference plane, i.e., the side in which an electron beam is applied relative to the reference plane. If the c-axis of the Sn crystal grain is inclined relative to the reference plane, the orientation point is marked at a position shifted from the very top of the projection sphere according to the inclination. A diagram in which a crystal orientation is displayed in such a manner is called a "pole figure". By EBSD, it is possible to set a sample surface to be measured as the reference plane, measure the crystal orientation of the sample at a position on the measurement sample surface in which an electron beam is applied, and determine the position of the orientation point on the projection sphere. For example, in the case of performing EBSD measurement on a region on a Sn crystal surface in which the c-axes are aligned perpendicularly to the reference plane, a crystal orientation map in which the entirety of the measured region indicates a (001) orientation is displayed. In this case, on the projection sphere, the crystal orientation is displayed as a single point K representing such a c-axis orientation that the (001) plane faces in the same direction as the measurement surface. On the other hand, in the case of performing EBSD measurement on a polycrystalline region having more than one crystal orientation, many orientation points are discretely displayed on substantially the entire surface of the projection sphere above the reference plane. Example of the orientation points in this case are illustrated by x's. If the points are densely located in a certain region on the projection sphere, the c-axes of the Sn crystals can be considered to be oriented in directions from the center of the projection sphere towards the points. For example, the orientation points in the case of measuring a sample containing many crystals with an overall c-axis orientation are illustrated by solid triangles.

Figure 2B:
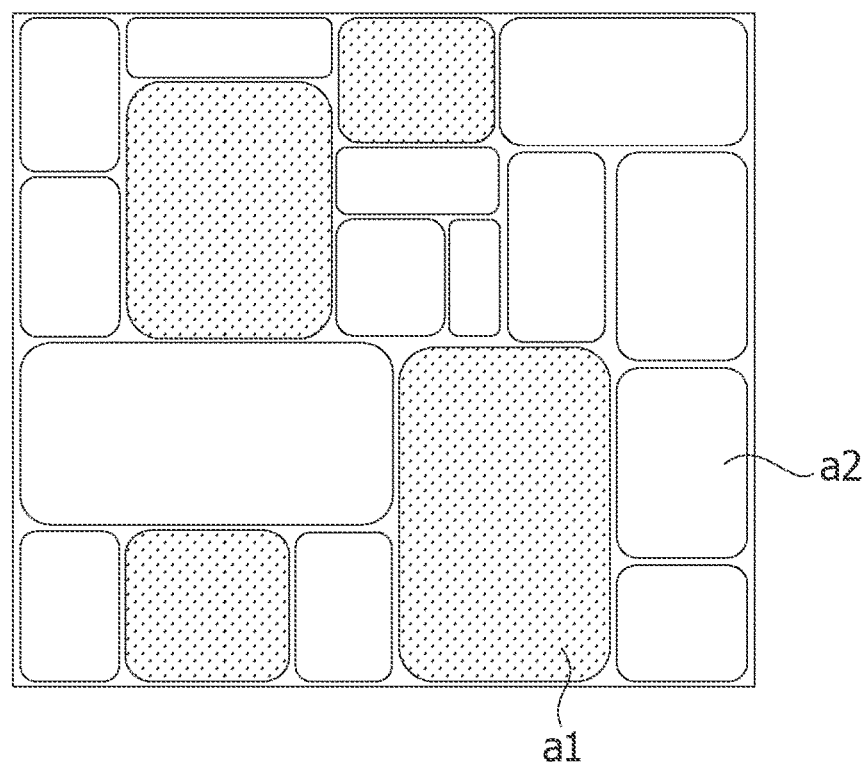

Next, a degree of c-axis alignment A, which is an index of an overall c-axis orientation, will be described. For example, in the case of performing EBSD measurement on a Sn polycrystal, a crystal orientation map of the measured region can be obtained as mentioned above. With EBSD, among the crystal grains in the measured region, only crystal grains having c-axes inclined at not greater than a specific angle θ from a line perpendicular to the reference plane and passing the center of the projection sphere, as illustrated with the dashed lines inside the projection sphere, can be extracted and mapped. FIG. 2B is a diagram illustrating an example of a crystal orientation map obtained by extracting crystals having specific orientations. In FIG. 2B, crystals "a1" in which c-axes have a specific orientation are illustrated with dots. Crystals "a2" in which c-axes do not have the specific orientation are illustrated without dots. Based on the crystal orientation map, the area of the portions in which the c-axes have the specific orientation is derived, and the ratio of this area to the area of the measured region (the entire region scanned with an electron beam) is derived. In this way, it is possible to figure out the ratio in area of the crystals having the specific orientation. This area ratio can be set as the degree of c-axis alignment A for the specific c-axis orientation. Specifically, A is defined by Equation (1) below.

degree of c-axis alignment A=Area of portion(s) in crystal orientation map by EBSD measurement in which c-axes are aligned in specific direction/Area of measured region (1)

When one of the pressed surfaces "p", which are side surfaces of a sheet-shaped solder 1 illustrated in FIG. 1B, is the measurement surface, a ratio Av of Sn crystals with c-axes aligned in a direction perpendicular to the pressed surface (measurement surface) is defined by Equation (1a) below.

Av=Area of portion(s) in crystal orientation map by EBSD measurement on pressed surface as measurement surface in which c-axes are aligned in direction perpendicular to measurement surface/ Area of measured region (1a)

The pressed surfaces are not limited to the surfaces contacted by a pressing machine, and include surfaces perpendicular to the pressing direction.

Figure 5:
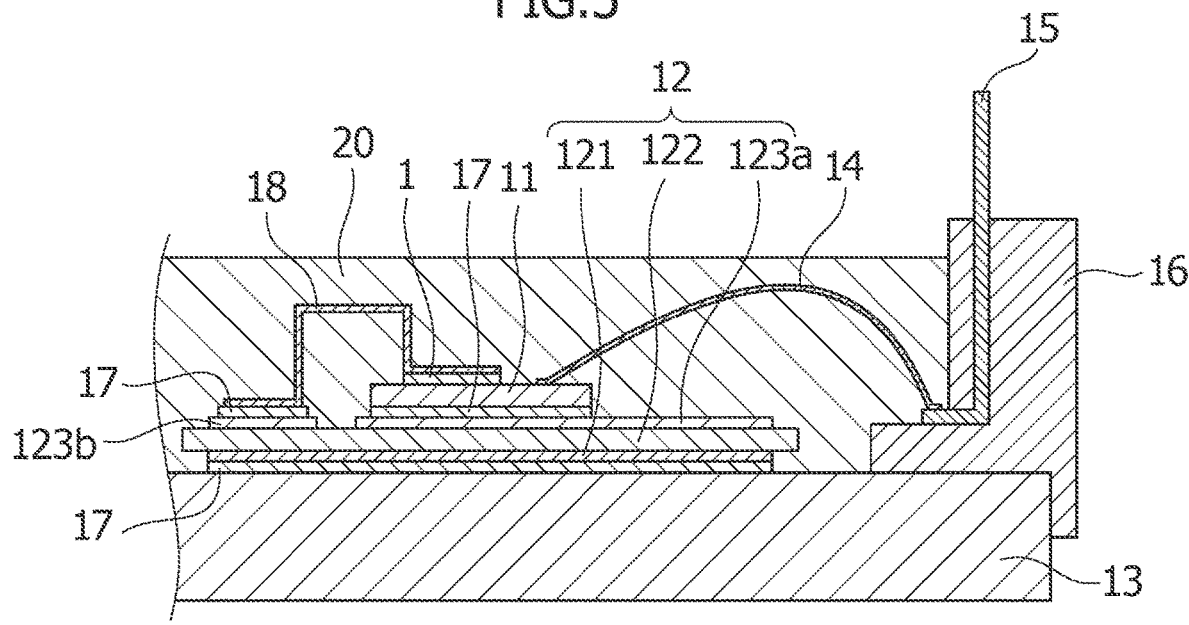
FIG. 5 is a conceptual diagram illustrating a cross-sectional structure of a semiconductor device according to a third embodiment of the present invention.

In the present invention, EBSD measurement is performed with one of the pressed surfaces "p" of the sheet-shaped solder 1 in FIGS. 1A and 1B as the reference plane B in the projection sphere in FIG. 2A. Crystals having c-axes with an inclination θ of not greater than 26° from the c-axis indicated by the arrow c in FIG. 2A can be described as crystals with c-axes aligned in a direction perpendicular to the sheet thickness direction of the sheet-shaped solder, and are defined as crystals having an overall c-axis orientation. This is because, in the sheet-shaped solder according to the present invention, as long as the inclination θ of the c-axes of Sn crystals, which are the primary component of the solder, at a pressed surface is not greater than 26°, the c-axes can be considered to be substantially perpendicular to the pressed surface, and also, electromigration can be prevented in the case in which the sheet-shaped solder is incorporated in a semiconductor module with the main surface "m" arranged in parallel to the upper surface of one or more semiconductor elements (FIG. 5).

Regarding the measurement conditions for the degree of c-axis alignment A, the measurement surface can be, for example, one of the pressed surfaces "p" of the solder material, and the measurement region can be, for example, a 400 μm×400 μm region. The incident angle of the electron beam may be approximately 20° relative to the measurement surface, and the electron beam may be scanned in 2.5 μm steps. If the measurement surface is a pressed surface (side surface) of the sheet-shaped solder, but it does not have a 400 μm×400 μm region as the measurement region, it is possible to use, for example, a rectangular region with the same area as the measurement region. If the measurement region contains an alloy phase such as Sn—Ag or contains high melting-point metal particles or a high melting-point metal wire, the degree of c-axis alignment A can be calculated with these excluded. The alloy phase, Cu, and the like have different crystal structures from that of Sn and therefore have different electron diffraction patterns (Kikuchi patterns). Thus, the presence of the crystal other than Sn can be distinguished. When the amount of Sn is not less than 80 wt %, the Sn crystals make up a major part of the solder. Hence, the overall orientation of the Sn crystal grains can be controlled. Also, when the amount of Sn is not less than 80 wt %, the solder exhibits ductility like Sn. Hence, the Sn crystals can be aligned by pressing, as will be described below.

When the degree of c-axis alignment Av of one of the pressed surfaces "p" used as the measurement surface is in a range of 0.05 to 0.2, for example, the orientation of the Sn crystals is defined as a random orientation. A random orientation refers to a state in which the c-axes do not have a specific overall orientation. When Av is greater than 0.2, the c-axes of the Sn crystals can be considered to be aligned perpendicularly to the thickness direction. Av is preferably not less than 0.3 and preferably not greater than 0.95. Note that the thickness direction is the Z direction in FIG. 1B. When a sheet-shaped solder having a degree of c-axis alignment A in the above range is placed with the main surface "m" in parallel to a back-surface electrode or laminated substrate of a semiconductor device and used to join a semiconductor element, EM is prevented and the power cycle capability is thus increased.

By performing EBSD measurement on the main surface "m" as the measurement surface, it is possible to confirm that the sheet-shaped solder according to the present embodiment has a preferable degree of c-axis alignment. Specifically, by evaluating the ratio of Sn crystals with c-axes aligned in a direction parallel to the main surface "m", it is possible to confirm that the c-axes of Sn crystals are aligned in a direction perpendicular to the thickness direction of the sheet-shaped solder, and preferably, that the degree of c-axis alignment Av, which is an index of the overall c-axis orientation of the Sn crystals, is not less than 0.3. In this case, assuming that the main surface "m" is the measurement surface, Ap, which is the ratio of Sn crystals with c-axes aligned in a direction parallel to the measurement surface and perpendicular to side surfaces (pressed surfaces "p"), is defined by Equation (1b) below.

Ap=Area of portion(s) in crystal orientation map by EBSD measurement on main surface as measurement surface in which c-axes are aligned in direction parallel to measurement surface and perpendicular to side surfaces(pressed surfaces)/ Area of measured region (1b)

In the sheet-shaped solder according to the present embodiment illustrated in FIGS. 1A and 1B and a solder joint according to a below-described second embodiment illustrated in FIG. 4, the c-axis of Sn is aligned in a direction parallel to the main surface "m" and perpendicular to the pressed surfaces. In this case, Ap is practically the same as Av of Sn crystals in one of the side surfaces (pressed surfaces) as the measurement surface having c-axes aligned in a direction perpendicular to the pressed surface. EBSD is a method by which the orientations of crystals can be determined to only one orientation. Thus, it is possible to derive the degree of alignment of Sn crystals in a measurement coordinate system as viewed from one of the pressed surfaces "p" by performing measurement on the pressed surface "p" as with Av or by performing measurement on the main surface "m" as with Ap. Hence, the overall c-axis orientation of the sheet-shaped solder according to the present embodiment can be obtained by Equation (1a) or (1b) described above using EBSD with one of the pressed surfaces "p" or the main surface "m" as the measurement surface.

It is to be noted that the c-axes of Sn crystals need only be aligned perpendicularly to the thickness direction, and that the orientation of the c-axes may be randomly different in the X-Y plane illustrated in FIG. 1A.

Next, a method of manufacturing the sheet-shaped solder according to the present embodiment will be described. The method of manufacturing the sheet-shaped solder includes the following steps.

(1) a step of preparing a solder block
(2) a step of pressing the prepared solder block
(3) a step of cutting the pressed solder block In the step (1), a solder block as a material is prepared. As the solder block, one that is commercially available can be used. Alternatively, the solder block can be prepared by melting raw materials selected from among Sn and additional elements or a mother alloy containing the raw materials in an electric furnace according to a common method. The purchased or prepared solder block having a predetermined constitution is preferably melted at the liquidus temperature or higher and then rapidly cooled. The melting temperature is not less than the liquidus temperature and is preferably in a temperature range up to the liquidus temperature plus 100° C. Also, the rapid cooling refers to cooling down to 100° C. at a rate of not less than 5° C./min. In this way, it is possible to obtain a solder block in an initial state in which the c-axes of its Sn crystal lattices are randomly oriented. In the step (1), the overall c-axis orientation of the Sn crystal lattices in the obtained solder block in the initial state is preferably measured by EBSD and checked. This EBSD measurement can be performed on the surfaces to be pressed in the next step. Moreover, the step (1) may include a step of cutting the solder block into a shape and dimensions suitable for the die in the next step. As a result of analyzing the rapidly cooled block by electron diffraction with a transmission electron microscope (TEM), etc., it has been confirmed that the block does not have a specific overall orientation but has random orientations.

In the step (2), the solder block in the initial state is placed in a die and pressed. The die is not particularly limited as long as it is a common die used in pressing. In one example, a metal die can be used. It is preferable to use a die with which a pressure of about 0.1 to 40 MPa and preferably 0.3 to 25 MPa can be applied. Also, it is preferable to include a heater or the like capable of heating the surface of the die to be in contact with the solder block to such a temperature that the βSn phase can be maintained, the temperature being about the solidus temperature (K)×0.7 to the solidus temperature (K)×0.95 and preferably about the solidus temperature (K)×0.8 to the solidus temperature (K)×0.9. With the temperature of the die set within the above range, the sheet-shaped solder material can be molded well without cracking. The die preferably has such a shape that a solder block of a substantially prism shape can be obtained by pressing. Thus, a pressing surface "p" of the metal die is preferably a quadrangular shape in top view. Considering that the solder block will be cut in a subsequent step, the lengths of its edges are preferably the dimensions of the shape of the sheet to be actually used.

Figure 3:
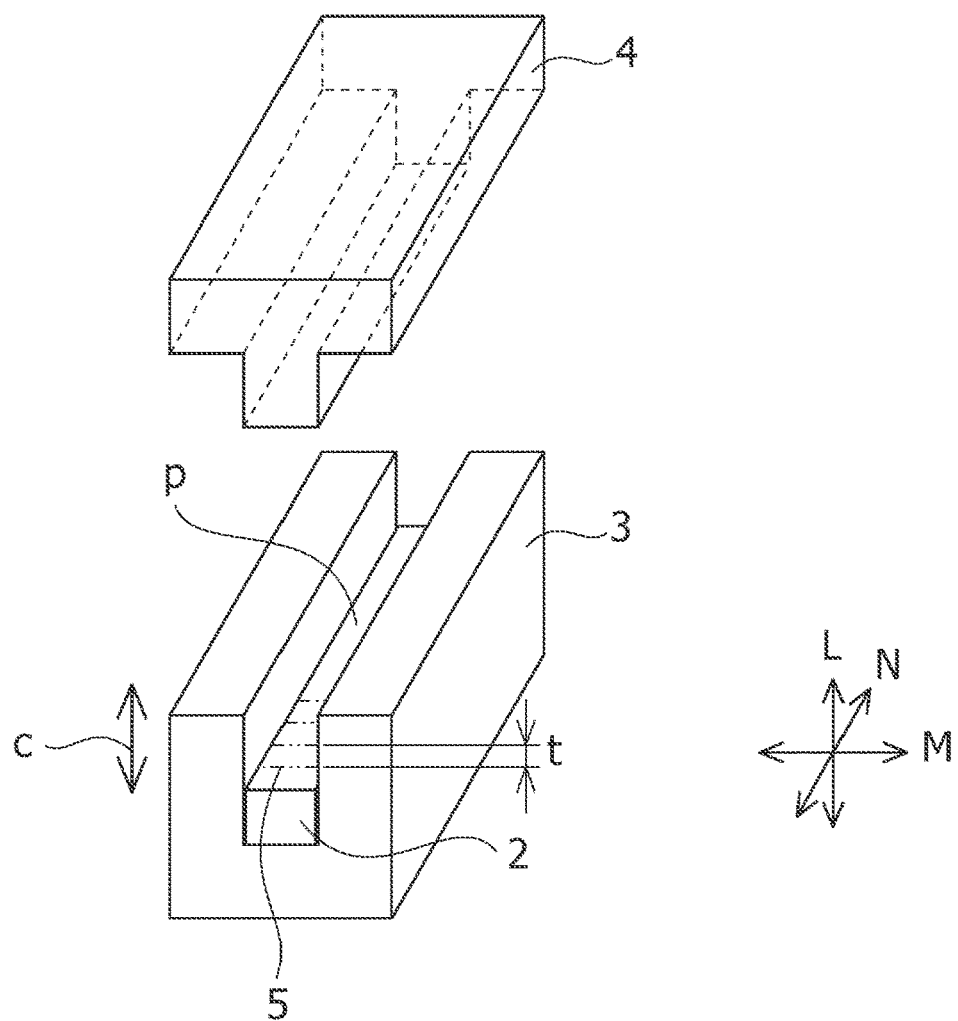
FIG. 3 is a conceptual perspective view illustrating an example of press dies usable in a process of manufacturing the sheet-shaped solder according to the first embodiment of the present invention.

FIG. 3 is a conceptual perspective view illustrating an example of press dies usable in the step (2) and a pressed solder block. In FIG. 3, L, M, and N represent the vertical direction, the transverse direction of the dies, and the longitudinal direction of the dies, respectively. In this step, the solder block in the initial state is placed in a groove in a lower metal die (lower half) 3, and the metal die is heated to a predetermined temperature by a heater (not shown). Thereafter, an upper metal die is placed in contact with the solder block and applies a pressure in the direction L in FIG. 3. The pressure and compression rate in the pressure application can be a pressure and compression which is derived by testing a solder alloy with a desired constitution in advance within the above range of pressures and with which a desired value of the degree of c-axis alignment can be achieved. In one embodiment, if it is confirmed in the step (1) that the solder block in the initial state has random orientations, the thickness of the solder block after the pressure application can be 5% to 95% of the initial thickness. Note that the pressed surface "p" serving as the EBSD measurement surface in the measurement of the degree of c-axis alignment A is a surface perpendicular to the direction of the pressure applied during the pressing. Of the surfaces perpendicular to the direction of the pressure applied during the pressing, the surface to be in contact with the upper metal die during the pressing and the surface to be in contact with the lower metal die during the pressing can both be referred to as pressed surface "p". In the embodiment illustrated in FIG. 3, the upper and lower surfaces of a solder block 2, which are parallel to the M-N plane, are the pressed surfaces "p". The dies are designed such that the solder block 2 will have a prism shape when pressed, and the shape of the solder block before being placed in the die can be adjusted.

By applying a pressure in the predetermined direction L in the step (2), the solder alloy containing Sn as the primary component is plastically deformed. In this way, the c-axes can be aligned in a direction parallel to the pressure application direction L. The arrow "c" in FIG. 3 indicates the direction of the c-axes of Sn crystal lattices in the compressed solder block 2 after the pressing. It is preferable to further include a step of measuring the degree of c-axis alignment A by EBSD and checking the degree of c-axis alignment A at the end of the step (2). The electron beam incident surface in this step can be one of the pressed surfaces "p".

In the step (3), the rod-shaped solder block 2 after the pressing is cut in a direction parallel to the pressure application direction, i.e., in a direction parallel to the c-axes. In the embodiment illustrated in FIG. 3, the solder block 2 can typically be cut parallel to the L-M plane or the L-N plane. While the cutting means is not particularly limited, a wire saw, an electric discharge machine, or the like can be used. In FIG. 3, an example of cutting positions 5 in the case of cutting the compressed solder block 2 along planes parallel to the L-M plane is illustrated with double chained lines. By cutting the compressed solder block 2 at each of the positions indicated by the double chained lines along a plane parallel to the L-M plane, the single solder block 2 can be cut into a plurality of pieces of a sheet-shaped solder having a surface formed by the cutting (cut surface) as a main surface and having a thickness corresponding to a cutting interval t. Also, of the two pairs of opposed surfaces of each cut piece of cuboidal sheet-shaped solder excluding its main surface, one pair are the pressed surfaces. By this step, the sheet-shaped solder illustrated in FIG. 1 can be obtained, in which the c-axes of Sn crystals are aligned perpendicularly to the thickness direction of the sheet.

The sheet-shaped solder thus obtained can be used to join electronic devices, and in particular, to join a semiconductor element and an electrically conductive connection member. Here, the surface parallel to the X-Y plane illustrated in FIG. 1 is the main surface "m" of the sheet-shaped solder, and the sheet-shaped solder can be disposed such that the main surface "m" and the surface "f" opposed thereto are each in contact with an electrode surface of a semiconductor element or an electrically conductive connection member, such as a lead frame. In this way, the c-axes can be aligned in a direction perpendicular to the thickness direction of the sheet-shaped solder already at a stage before the joining. The sheet-shaped solder according to the present embodiment can be preferably used in manufacture of a solder joint for causing, in particular, a large current with a current density of not less than 500 A/cm$^2$ or even not less than 1000 A/cm$^2$ to flow.

Second Embodiment: Solder Joint

According to a second embodiment, the present invention relates to a solder joint. The solder joint according to the present embodiment includes a semiconductor element, an electrically conductive connection member, and a solder joining layer being the sheet-shaped solder according to the first embodiment melted between the semiconductor element and the electrically conductive connection member.

Figure 4:
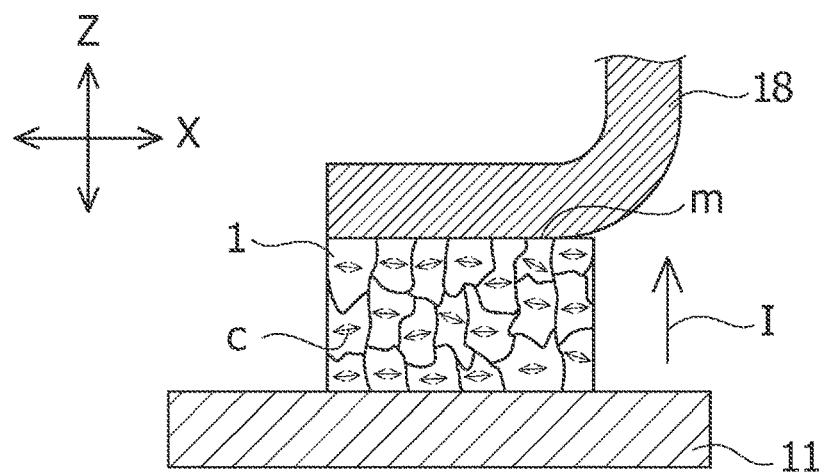
FIG. 4 is a conceptual diagram illustrating a cross-sectional structure of a solder joint according to a second embodiment of the present invention.

FIG. 4 is a conceptual cross-sectional view illustrating an example of the solder joint according to the present embodiment. Referring to FIG. 4, a semiconductor element 11, the melted sheet-shaped solder 1, and a lead frame 18 as an example of the electrically conductive connection member are laminated. Note that the melted sheet-shaped solder represents a solid state in which the solder material having been heated and melted is joined to a joined body.

The solder joint according to the present embodiment is formed by joining a front-surface electrode of the semiconductor element 11 and the lead frame 18 to each other with the melted sheet-shaped solder 1. As described in the first embodiment, the sheet-shaped solder 1 is melted with the main surface "m" or the surface f opposed thereto illustrated in FIG. 1 disposed in contact with an electrode of the semiconductor element 11 or an electrically conductive connection member (such as the lead frame 18). Note that the melting of the sheet-shaped solder 1 by heating in the joining operation does not practically change the overall c-axis orientation of the Sn crystals forming the solder alloy, and the c-axes of the Sn crystals in the solder joint are also aligned perpendicularly to the thickness direction Z of the sheet. In FIG. 4, the arrows "c" indicate the orientation of c-axes. In the illustrated solder joint, an electric current flows from the semiconductor element 11 to the lead frame 18 in the direction indicated by the arrow I or in the reverse direction. That is, the orientation of c-axes are aligned to be perpendicular to the current direction I. Accordingly, the solder joint is not susceptible to electromigration. Note that the solder joint may be a part formed by joining the semiconductor element 11 and a second electrically conductive plate 123a of a laminated substrate to each other with the sheet-shaped solder 1.

Figure 6:
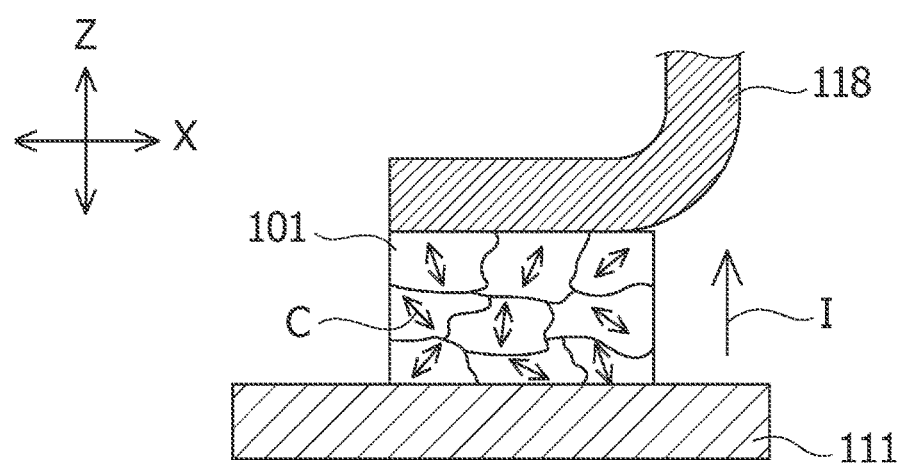
FIG. 6 is a conceptual diagram illustrating a cross-sectional structure of a solder joint according to the conventional technique.

FIG. 6 is a conceptual cross-sectional view illustrating an example of a solder joint using a conventional solder material. The solder joint is formed by joining a front-surface electrode of a semiconductor element 111 and a lead frame 118 to each other with a melted sheet-shaped solder 101. In the solder joining layer obtained by melting the conventional solder material, the c-axes of the Sn crystal lattices do not have a specific overall orientation relative to the thickness direction Z of the sheet, but are oriented in random directions. Specifically, the current direction indicated by the arrow I and the c-axes of the Sn crystal lattices indicated by the arrows c are not perpendicular to each other. Then, when a large current with a current density of, e.g., not less than 500 A/cm$^2$ is caused to flow, atoms move due to electromigration, thereby forming atom-deficient sites. This may lead to disconnection or the like. According to the present invention, it is possible to obtain a solder joint which, as compared to conventional solder joints, is not susceptible to defects such as disconnections and is particularly reliable in the case in which a large current with a current density of not less than 500 A/cm$^2$ or even not less than 1000 A/cm$^2$ is caused to flow therethrough, by aligning the c-axes of Sn crystal lattices in the solder joint in a predetermined direction.

Note that the electrically conductive member is not limited to the lead frame 18 and may be any electrically conductive member used in a semiconductor device, such as an aluminum wire or a pin.

Next, a method of manufacturing the solder joint will be described. The method of manufacturing the solder joint only need only be such that the sheet-shaped solder and a semiconductor element and a contact surface of a lead frame, which are being joined bodies, are provided as described above, or the sheet-shaped solder and a semiconductor element and a contact surface of a second electrically conductive plate of a laminated substrate, which are joined bodies, are provided as described above. Other conditions can be implemented similarly to common joining methods. Specifically, the method includes a pre-processing step of etching the sheet-shaped solder with an acid or the like to remove an oxide film, and a step of heating the sheet-shaped solder in a reducing atmosphere to perform soldering. The reducing atmosphere may be an atmosphere with hydrogen or the like. The solder joining temperature can be determined as appropriate according to the constitution of the solder alloy.

While there is no intention to impose a theoretical restriction, it is known that melting a solder makes the orientations of its Sn crystal lattices locally random. However, as the solder solidifies, it forms large crystals on the order of several hundreds of μm, and thus, the average orientation of the solder before being melted presumably determines the orientation of the solder after being melted. The overall c-axis orientation of the solder joining layer generated after melting the solder alloy can be checked by cutting off a piece of the solder joining layer and performing EBSD measurement on it. More specifically, from the semiconductor device after being manufactured, a piece of the solder joining layer may be cut off. From the piece of solder joining layer, a sample may be prepared in which a surface parallel to the pressed surfaces will serve as a measurement surface. By performing EBSD measurement on this sample, the degree of c-axis alignment A can be obtained.

Third Embodiment: Semiconductor Device

According to a third embodiment, the present invention relates to a semiconductor device. The semiconductor device according to the present embodiment includes the solder joint according to the second embodiment.

FIG. 5 illustrates a conceptual cross-sectional view of a power semiconductor module as an example of the semiconductor device according to the third embodiment of the present invention. The illustrated power semiconductor module has a laminated structure in which the semiconductor element 11 and a laminated substrate 12 are joined by a joining layer 17 on a heat dissipation plate 13, and includes a solder joining layer 1 being the sheet-shaped solder according to the first embodiment melted between the semiconductor element 11 and the lead frame 18. A case 16 incorporating an external terminal 15 is bonded to the heat dissipation plate 13. Electrodes of the semiconductor element 11 and the laminated substrate 12 are connected by the lead frame 18, which is an electrically conductive connection member. The semiconductor element 11 and the external terminal 15 are connected by an aluminum wire 14. A sealant 20 is filled in contact with sealed members such as the semiconductor element 11, the laminated substrate 12, the lead frame 18, the aluminum wire 14, which is an electrically conductive connection member.

The semiconductor element 11 is a power chip, such as an insulated gate bipolar transistor (IGBT) or a diode chip. The semiconductor element may be an Si device or a wide-bandgap semiconductor device such as a SiC device, a GaN device, a diamond device, or a ZnO device, or a combination of these may be used. For example, a hybrid module using a Si-IGBT and a SiC-SBD or the like can be used. The number of the semiconductor elements 11 to be mounted may be one or two or more.

The laminated substrate 12 can include an insulating substrate 122, a first electrically conductive plate 121 with a predetermined shape (pattern) formed on one of the main surfaces of the insulating substrate 122, and second electrically conductive plates 123a and 123b formed on the other main surface. For the insulating substrate 122, a material with good electrical insulating properties and thermal conductivity can be used. Examples of the material of the insulating substrate 122 include $Al_2O_3$, AlN, SiN, etc. In particular, in high withstand voltage applications, materials having both satisfactory electrical insulating properties and satisfactory thermal conductivity are preferable, and AlN and SiN may be used. However, the material is not limited to these. For the first electrically conductive plate 121 and the second electrically conductive plates 123a and 123b, materials with good workability, such as Cu and Al, may be used. Also, the electrically conductive plates may be made of Cu or Al subjected to a process such as Ni plating for the purpose of rust prevention or the like. Examples of the method of arranging the electrically conductive plates 121, 123a, and 123b on the insulating substrate 122 include direct copper bonding and active metal brazing. In the embodiment illustrated, the two second electrically conductive plates 123a and 123b are provided on the insulating substrate 122 in a non-continuous manner, and one of the two, namely, the second electrically conductive plate 123a functions as an electrode to be joined to the semiconductor element 11 while the other second electrically conductive plate 123b functions as an electrode to be connected to the lead frame 18.

The lead frame 18 is an electrically conductive connection member connecting the semiconductor element 11 and the second electrically conductive plate 123b, etc. Specifically, the lead frame 18 is joined to an electrode (front electrode) of the semiconductor element 11 by the joining layer 1 obtained by melting the sheet-shaped solder according to the first embodiment. Also, while the lead frame 18 can be joined to wiring portions of the second electrically conductive plate 123b, etc. by the joining layer 17, which is made of a common solder material, the lead frame 18 may be joined to them by using the sheet-shaped solder 1 according to the first embodiment. The lead frame 18 may be made of a metal such as copper or a copper-containing alloy. A Ni or Ni alloy layer or a Cr or Cr alloy layer may be formed on the surface of the lead frame 18 by plating or the like. In this case, the thickness of the Ni or Ni alloy layer or the Cr or Cr alloy layer can be not more than about 20 μm. Note that a pin-shaped lead terminal, a wire of aluminum, copper, or the like for use in wiring bonding, and the like are usable as the electrically conductive connection member connecting the semiconductor element 11 and the second electrically conductive plate 123b, etc., besides the lead frame.

For the heat dissipation plate 13, a metal with good thermal conductivity, such as copper or aluminum, is used. Also, the heat dissipation plate 13 can be covered with Ni or a Ni alloy to prevent corrosion. The heat dissipation plate may be a cooling apparatus having a water cooling function, an air cooling function, or the like.

The joining layer 17 can be formed from a common lead-free solder. For example, a Sn—Ag—Cu-based solder, Sn—Sb-based solder, Sn—Sb—Ag-based solder, Sn—Cu-based solder, Sn—Sb—Ag—Cu-based solder, Sn—Cu—Ni-based solder, Sn—Ag-based solder, and the like are usable but the material is not limited to these. Alternatively, the joining layer can be formed from a connecting material containing fine metal particles, such as sintered silver nanoparticles. It is also possible to use a joining layer obtained by melting the sheet-shaped solder according to the first embodiment, instead of a common lead-free solder.

The case 16 may be made of a thermoplastic resin, such as polyphenylene sulfide (PPS) or polybutylene terephthalate (PBT).

In the present embodiment, members including the semiconductor element 11, the laminated substrate 12, and the electrically conductive connection members such as the lead frame 18 and the aluminum wire 14 will also be referred to as "sealed members". The sealant 20 is filled on the sealed members. The sealant 20 contacts the semiconductor element 11, the laminated substrate 12, and the electrically conductive connection members to cover the peripheries of these sealed members.

The sealant 20 contains a cured thermosetting resin composition which contains a thermosetting resin main agent, a curing agent, and an inorganic filler and may optionally contain a curing accelerator and additives.

Examples of the thermosetting resin main agent include, but are not particularly limited to, epoxy resins, phenolic resins, maleimide resins, etc., with thermal resistance and high insulation properties. Of these, an epoxy resin having at least two epoxy groups in one molecule is particularly preferable for its high dimensional stability, water resistance, chemical resistance, and electrical insulation properties. Specifically, it is preferable to use an aliphatic epoxy resin such as a bisphenol A epoxy resin, a bisphenol F epoxy resin, or a bisphenol AD epoxy resin, an alicyclic epoxy resin such as a monofunctional epoxy resin, a bifunctional epoxy resin, a multifunctional epoxy resin with three or more functional groups, or a mixture of these in any mixture ratio.

The inorganic filler may be a metal oxide or metal nitride with high thermal conductivity and a low coefficient of linear expansion, and examples include, but are not limited to, fused silica, silica (silicon oxide), alumina, aluminum hydroxide, titania, zirconia, aluminum nitride, talc, clay, mica, glass fiber, etc. As the inorganic filler, it is preferable to use one with an average particle size of about 0.2 to 20 μm. The content of the inorganic filler in the sealant 20 is preferably 100 to 600 parts by mass and more preferably 200 to 400 parts by mass relative to the mass of the matrix resin being 100 parts by mass. If the content of the inorganic filler is less than 100 parts by mass, the coefficient of thermal expansion of the sealant 20 is so high that detachment and cracking are likely to occur. If the content is more than 600 parts by mass, the viscosity of the composition increases such that extrudability may be poor.

While the curing agent is not particularly limited, as long as it can cure via a reaction with the thermosetting resin main agent, preferably with an epoxy resin main agent, it is preferable to use an acid anhydride-based curing agent. The content of the curing agent is preferably not less than about 50 parts by mass and not greater than 170 parts by mass and more preferably not less than about 80 parts by mass and not greater than 150 parts by mass relative to the epoxy resin main agent being 100 parts by mass. If the content of the curing agent is less than 50 parts by mass, the glass transition temperature may drop due to insufficient cross-linking. If the content is greater than 170 parts by mass, the moisture resistance, heat distortion temperature, and thermal stability may drop.

The thermosetting resin composition forming the sealant 20 may further contain a curing accelerator as an optionally selectable component. The content of the curing accelerator is preferably not less than about 0.01 part by mass and not greater than 50 parts by mass and more preferably not less than about 0.1 part by mass and not greater than 20 parts by mass relative to the thermosetting resin main agent being 100 parts by mass.

The thermosetting resin composition forming the sealant 20 may also contain optionally selectable additives to such an extent as not to impair its characteristics. Examples of the additives include, but are not limited to, a flame retardant, a pigment for coloring the resin, a plasticizer for improving crack resistance, and a silicon elastomer. These optional components and their contents can be determined as appropriate by one skilled in the art according to specifications required for the semiconductor device and/or the sealant 20.

Next, a method of manufacturing the illustrated power semiconductor module will be described. The heat dissipation plate 13, the laminated substrate 12, and the semiconductor element 11 are joined, and the case 16 is attached to the heat dissipation plate 13. Thereafter, the sheet-shaped solder according to the first embodiment is placed on the front-surface electrode of the semiconductor element 11, and the lead frame 18 is joined. Specific conditions for the joining are the same as in the second embodiment. Moreover, wire bonding is performed with the aluminum wire 14. Thereafter, the thermosetting resin composition forming the sealant 20 is injected into the case 16 and is heated to cure it. The heat curing step can be, for example, two-stage curing. In the case of using an epoxy resin as the thermosetting resin main agent, it is heated at 90 to 120° C. for 1 to 2 hours to be in a semi-cured state (pre-cured). Thereafter, the epoxy resin can be heated at 175 to 185° C. for 1 to 2 hours (final curing). The final curing can be performed by continuously raising the temperature from the pre-curing. However, the heat curing step is not limited to particular temperatures and times, and does not have to be two-stage curing in some cases.

As a modified form of the illustrated power semiconductor module, a primer layer may further be included. The primer layer can be formed at interfaces between the sealed members including the laminated substrate, the semiconductor element, the electrically conductive connection members, and the sealant 20. The primer layer provides a stress relaxing effect at interfaces between the sealant 20 and the sealed members, and may be preferably used from the viewpoint of ensuring adhesion. The primer layer may be a layer consisting of a resin containing a polyamide, a polyimide, or a polyamide-imide.

The sealant 20 may be formed further of one or more thermosetting resin layers with different constitutions, and also include a resin sealing layer that is not a thermosetting resin sealing layer. For example, the sealant 20 may include a thermoplastic resin layer for covering its surface that is in contact with the atmosphere. In this case too, the primer layer may or may not be included.

In a method of manufacturing the power semiconductor module including a primer layer, the primer layer is formed after assembling the sealed members but before injecting the thermosetting resin composition forming the sealant 20. The primer layer can be provided on the entire surfaces of the sealed members including the semiconductor element 11, the lead frame 18, the laminated substrate 12, the aluminum wire 14, and the case 16 illustrated in FIG. 5 by, for example, spraying, immersion, application with a dispenser, or the like. The formation of the primer layer is preferably followed by stepwise heating in an inert gas oven filled with a nitrogen gas at 70 to 100° C. for about 60 to 80 minutes, and then at 200 to 220° C. for 60 to 80 minutes. This heating operation can heat Cu forming the lead frame 18 and vaporize the solvent to thereby solidify the primer. After the primer layer is formed, insulation sealing can be performed with the sealant 20 in a similar manner to the method of manufacturing the power semiconductor module illustrated in FIG. 5. In the case of optionally providing an additional resin sealing layer, the additional resin sealing layer can be formed by a common method.

The configuration of the illustrated power semiconductor module is a mere example, and the present invention is not limited to this configuration. For example, any electrically conductive connection members may be used, and implant pins are usable. Also, the configuration may be such that the lead frame or the wire is the only electrically conductive connection member. In the case of providing a primer layer in a module in which its electrically conductive connection member includes an implant pin, the primer layer can be formed also on the surface of the implant pin. In the case of providing a primer layer in a module in which a wire is the only electrically conductive connection member, the primer layer can be formed also on the surface of the wire.

Also, the power semiconductor module may be caseless, i.e., having no case. Though not shown, the structure of a caseless power semiconductor module is, for example, one in which implant pins, in place of the lead frame and the aluminum wire in FIG. 5, and a printed circuit board joined to the implant pins are provided, and members including these are sealed with a thermosetting resin sealing layer. As the printed circuit board, it is possible to use one including a polyimide film substrate or an epoxy film substrate and electrically conductive layers made of Cu, Al, or the like formed in and/or on it. As the implant pins, copper pins using copper can be used. The electrically conductive layers of the printed circuit board and the implant pins may be Cu or Al subjected to a process such as Ni plating for the purpose of rust prevention and the like. The printed circuit board and the implant pins electrically connect semiconductor elements or a semiconductor element and a laminated substrate. The implant pins can be joined to the laminated substrate or one or more semiconductor elements by a solder joining layer. Also, by leading out the implant pins from the surface of the laminated substrate to the outside of the thermosetting resin sealing layer, the implant pins can be formed as external connection terminals. To manufacture the power semiconductor module with such a configuration, the sealed members including the laminated substrate, the semiconductor element, the implant pins, and the printed circuit board are assembled, and the primer layer is optionally formed on the surfaces of the laminated substrate, the semiconductor element, the implant pins, and the printed circuit board by a method such as spraying. Thereafter, the sealed members are placed in a suitable mold, and the thermosetting resin composition forming the thermosetting resin sealing layer can be filled into the mold and cured. Examples of the method of molding the sealant include vacuum casting, transfer molding, liquid transfer molding, potting, etc. However, the molding method is not limited to a specific method.

According to the present embodiment, a solder joint is included by connecting a semiconductor element and an electrically conductive connection member with the sheet-shaped solder according to the first embodiment. In this way, a semiconductor device that prevents electromigration, and therefore has high reliability, can be obtained. The semiconductor device according to the present embodiment is expected to be highly reliable, particularly in applications in which a large current with a current density of not less than 500 A/cm$^2$ or even not less than 1000 A/cm$^2$, is caused to flow.

EXAMPLES

The present invention will be described in further detail below through examples of the present invention. However, the present invention is not limited to the scope of the following examples.

1. Manufacture of Sheet-Shaped Solders

In Examples 1 to 6 and Comparative Examples 1 and 2, sheet-shaped solders were manufactured using a solder block consisting of an Sn3.5Ag solder alloy containing 3.5% by mass of Ag and the balance consisting of Sn and incidental impurities. First, a solder block was heated at 300° C. to be melted, and then cooled down to 100° C. at the rate of not less than 5° C./min, so that a solder block with Sn crystals having randomly oriented c-axes was manufactured. The overall c-axis orientation of the Sn crystals in this solder block was measured by EBSD to obtain the value of the degree of c-axis alignment A. The value of A was 0.1. It was confirmed that the c-axes were randomly oriented. A solder material obtained by cutting the solder block with the randomly oriented c-axes into a length of 5000 μm, a width of 5000 μm, and a thickness of 100 μm without compressing the solder material was designated as Comparative Example 1.

This solder block was placed in a die exemplarily illustrated in FIG. 3 and pressed to obtain six solder blocks differing in pressing ratio. The pressing ratio is defined below. "Thickness" is the thickness of the solder block.

Pressing ratio=(Initial thickness−Thickness after pressing)/Initial thickness

The pressed solder block was cut in a direction parallel to the direction of the pressing. More specifically, the pressed solder block was cut along the cutting positions 5 illustrated in FIG. 3 in parallel to the L-M plane, so that sheet-shaped solders each having the cut surface as a main surface and measuring 5000 μm in length, 5000 μm in width, and 100 μm in thickness were obtained. These were designated as Examples 1 to 6.

A solder block pressed at a pressing ratio of 75% was worked such that its dimension in the direction parallel to the direction of the pressing became its thickness. More specifically, the solder block was cut such that the M-N plane illustrated in FIG. 3 was the main surface and the L direction was the thickness direction. As a result, a sheet-shaped solder measuring 5000 μm in length, 5000 μm in width, and 100 μm in thickness was obtained. This was designated as Comparative Example 2.

Sheet-shaped solders in Examples 7 to 14 were obtained in a similar manner to Example 1, except that the constitution of the solder alloy was changed. Note that the sample of Example 8 is the same as that of Example 1. Each constitution in Table 2 expressed as SnX [element A] Y [element B] means a constitution consisting of X % by mass of an element A, Y % by mass of an element B, and Sn and incidental impurities as the balance.

2. Manufacture of Semiconductor Devices

Each manufactured sheet-shaped solder was used for joining the semiconductor element and the lead frame in the power semiconductor module according to the third embodiment, and its reliability was evaluated. A Si IGBT was used as the semiconductor element, and a lead frame consisting of copper was used. Regarding the joining conditions, heating was performed at 310±5° C. for 5 minutes in a hydrogen reducing atmosphere containing 10% by volume of hydrogen (the volume ratio of $N_2$ to $H_2$ was 9:1) to join the semiconductor element and the lead frame.

3. Continuous Energization Test

Each semiconductor device manufactured was subjected to a continuous energization test for 500 hours with a current density of 800 A/cm$^2$. Thereafter, the current-voltage characteristic was evaluated. When the result was normal, it was designated as "Pass". An abnormal value was designated as "Fail". "Normal" means when the range of increase or decrease from the current-voltage characteristic in the initial state (before the test) was not greater than 20%. The current-voltage characteristic means the voltage upon application of a rated ON current and the leakage current upon application of a rated withstand voltage. "Abnormal value" means when the range of increase or decrease is greater than 20%.

4. Reliability Evaluation

The reliability was evaluated based on a $T_j$ power cycle capability ($T_j$ P/C capability). In the power cycle test, the number of cycles taken for electrical characteristic to reach abnormal values was investigated, with each single cycle performed under conditions of performing an energizing operation for one second followed by an off period of 4 seconds at to 175° C. ($\Delta T_j$=135° C.). The current density was 300 A/cm$^2$.

Table 1 shows the pressing ratio of the solder alloy, the degree of c-axis alignment Ap (Av) of the sheet-shaped solder, the result of the continuous energization test, and the $T_j$ P/C capability in each of Examples 1 to 6 and Comparative Examples 1 and 2. Note that the pressing direction in Comparative Example 2 was a direction different by 90° from the pressing direction in Examples 1 to 6 and Comparative Example 1, and a surface pressed at a pressing ratio of 75% was disposed in parallel to the joining surfaces of the element and the lead frame. Table 1 shows that semiconductor devices which could prevent EM and therefore had high reliability could be obtained when the degree of c-axis alignment Ap was 0.25 to 0.98 and more preferably 0.32 to 0.94. The pressing ratio of the solder block was shown to be effective when 5 to 99%, and more preferably 25 to 90%. Note that the value of the degree of c-axis alignment Ap in Comparative Example 1, which is 0.1, indicates that the c-axes were randomly oriented, and the value of the degree of c-axis alignment Ap in Comparative Example 2, which is 0.01, indicates that the c-axes were aligned in parallel to the thickness direction of the sheet-shaped solder. Regarding Comparative Examples 1 and 2, the current-voltage characteristic evaluation after the continuous energization test after 1 kilocycles indicated an abnormal value. In other words, the P/C capability was less than 1 kilocycles.

These results indicate that EM was prevented by aligning the c-axes of Sn crystals in parallel to the joining surfaces such that the degree of c-axis alignment A was a value close to 1. However, excessively aligning the c-axes in parallel to the joining surfaces resulted in a slight decrease in power cycle life (Example 6). While there is no intention to impose a theoretical restriction, aligning the c-axes excessively in parallel to the joining surfaces presumably leads to vulnerability to shear stress.

TABLE 1

| Example/Comparative Example | Example 1 | Example 2 | Example 3 | Example 4 | Example 5 | Example 6 | Comparative Example 1 | Comparative Example 2 |
|---|---|---|---|---|---|---|---|---|
| Pressing ratio (%) | 15 | 25 | 50 | 75 | 90 | 99 | 0 | 75 |
| degree of c-axis alignment Ap | 0.25 | 0.32 | 0.59 | 0.85 | 0.94 | 0.98 | 0.1 | 0.01 |
| Continuous energization test | Pass | Pass | Pass | Pass | Pass | Pass | Fail | Fail |
| P/C capability | 6.5 k | 20 k | 20 k | 20 k | 20 k | 10 k | <1 k | <1 k |

Table 2 shows the constitutions of the solder alloys in Examples 7 to 14, the content (% by mass) of Sn in each constitution, the pressing ratio, the degree of c-axis alignment Ap of the sheet-shaped solder, the result of the continuous energization test of the semiconductor device, and the $T_j$ P/C capability. Table 2 indicates that, as long as Sn is not less than 80%, various solder materials containing Sn as a primary component can be plastically deformed in substantially the same manner and C-axes can be aligned in a predetermined direction. The P/C capability was slightly poorer in Example 14, in which Sn was 82%, than in the others. In other words, it can be understood that the degree of c-axis alignment Ap is more preferably not less than 0.2 or not less than 0.23. Combining the results in Table 1, the degree of c-axis alignment Ap is preferably 0.2 to 0.98 and more preferably 0.32 to 0.94. Sn6Sb4Ag·2Ni0.001Ge in Example 12, etc., in which an intermetallic compound was formed at grain boundaries, was also plastically deformed and EM did not occur.

TABLE 2

| Example | 7 | 8 | 9 | 10 | 11 | 12 | 13 | 14 |
|---|---|---|---|---|---|---|---|---|
| Constitution | Sn0.75Cu | Sn3.5Ag | Sn5Sb | Sn6Sb4Ag | Sn10Sb | Sn6Sb4Ag.2Ni0.001Ge | Sn6Sb4Ag2Cu | Sn18Sb |
| Sn (% by mass) | 99.25 | 96.5 | 95 | 90 | 90 | 88 | 88 | 82 |
| Pressing ratio (%) | 15 | 15 | 15 | 15 | 15 | 15 | 15 | 15 |
| degree of c-axis alignment Ap | 0.28 | 0.25 | 0.24 | 0.24 | 0.23 | 0.23 | 0.23 | 0.20 |
| Continuous energization test | Pass | Pass | Pass | Pass | Pass | Pass | Pass | Pass |
| P/C capability | 6 k | 6.5 k | 7 k | 7 k | 6.5 k | 6.5 k | 6 k | 3 k |

According to the above examples, sheet-shaped solders that prevented electromigration were obtained, and solder joints and semiconductor devices with high reliability were obtained.

REFERENCE SIGNS LIST

1 sheet-shaped solder
m main surface
f surface opposed to main surface
p pressed surface
2 solder block
3 lower metal die (lower half)
4 upper metal die
11 semiconductor element
12 laminated substrate
121 electrically conductive plate
122 insulating substrate
123a, 123b electrically conductive plate
13 heat dissipation plate
14 aluminum wire
15 external terminal
16 case
17 joining layer
18 lead frame
20 sealant

What is claimed is:

1. A pressed sheet-shaped solder containing a solder alloy containing Sn as a primary component, at least one additional element, and incidental impurities, wherein
    a pressed surface of the sheet-shaped solder is a surface perpendicular to a main surface of the sheet-shaped solder, and
    c-axes of Sn crystals are aligned in a direction perpendicular to a thickness direction of the sheet-shaped solder,
    wherein a degree of c-axis alignment being an index of an overall c-axis orientation of the Sn crystals in the pressed surface is not less than 0.3 and not greater than 0.95.

2. The sheet-shaped solder according to claim 1, wherein the at least one additional element is selected from among Sb, Cu, Ag, Ni, Ge, and combination thereof.

3. A solder joint comprising:
    a semiconductor element;
    an electrically conductive connection member; and
    a solder joining layer being the sheet-shaped solder according to claim 1, melted between the semiconductor element and the electrically conductive connection member.

4. The solder joint according to claim 3, wherein the electrically conductive connection member is a lead frame.

5. A semiconductor device comprising the solder joint according to claim 3.

6. A method of manufacturing a semiconductor device comprising:
- pressing a solder alloy containing Sn as a primary component, an additional element, and an incidental impurity to thereby manufacture a sheet-shaped solder in which a pressed surface is a surface perpendicular to a main surface of the sheet-shaped solder and in which c-axes of Sn crystals are aligned perpendicularly to a thickness direction of the sheet-shaped solder;
- laminating a semiconductor element, the sheet-shaped solder, and an electrically conductive connection member; and
- melting the sheet-shaped solder.

7. The method of manufacturing a semiconductor device according to claim 6, wherein the pressing includes applying a pressure until a degree of c-axis alignment being an index of an overall c-axis orientation of Sn crystals reaches not less than 0.3.

8. The method of manufacturing a semiconductor device according to claim 6, further comprising cutting the pressed solder alloy in a direction parallel to a pressure application direction to obtain the sheet-shaped solder.

9. The method of manufacturing a semiconductor device according to claim 7, wherein the pressing includes applying a pressure until a degree of c-axis alignment being an index of an overall c-axis orientation of Sn crystals reaches not greater than 0.95.

* * * * *